United States Patent
Takai

(10) Patent No.: US 7,622,960 B2
(45) Date of Patent: Nov. 24, 2009

(54) METASTABLE-RESISTANT PHASE COMPARING CIRCUIT

(75) Inventor: Yasuhiro Takai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 72 days.

(21) Appl. No.: 12/073,409

(22) Filed: Mar. 5, 2008

(65) Prior Publication Data
US 2008/0218216 A1    Sep. 11, 2008

(30) Foreign Application Priority Data
Mar. 8, 2007    (JP)    ............... 2007-059091

(51) Int. Cl.
*G01R 25/00* (2006.01)
*H03D 13/00* (2006.01)
(52) U.S. Cl. ............................ 327/12; 327/7
(58) Field of Classification Search .................. 327/12, 327/7
See application file for complete search history.

(56) References Cited
FOREIGN PATENT DOCUMENTS
JP    2005-228426    8/2005

*Primary Examiner*—Lincoln Donovan
*Assistant Examiner*—Daniel Rojas
(74) *Attorney, Agent, or Firm*—McGinn IP Law Group, PLLC

(57) ABSTRACT

A phase comparing circuit includes a first storage circuit for reading an external clock signal based on a control clock signal; first and second inverters for inverting a signal from the first storage circuit based respectively on first and second threshold levels; third and fourth inverters for inverting respective signals output from the first and second inverters; a delay circuit for delaying the control clock signal by a specific time; a coincidence control circuit for setting the delayed control clock signal to be active when the signals from the third and fourth inverters coincide with each other, and setting it to be inactive when the signals from the third and fourth inverters do not coincide with each other; and a second storage circuit for reading a signal output form the first storage circuit when the delayed control clock signal is active, and outputting the read signal as the control signal.

4 Claims, 5 Drawing Sheets

METASTABLE-RESISTANT PHASE COMPARING CIRCUIT

BACKGROUND OF THE INVENTION

1. Field of the Invention

The present invention relates to a digital phase comparing circuit, and in particular, relates to a phase comparing circuit for preventing an erroneous operation of a next circuit connected thereto when a metastable phenomenon occurs.

Priority is claimed on Japanese Patent Application No. 2007-059091, filed Mar. 8, 2007, the contents of which are incorporated herein by reference.

2. Description of the Related Art

FIG. 4 is a general circuit diagram of a DLL (delay locked loop) used in a DDR SDRAM (double data rate synchronous dynamic RAM) or the like, and FIG. 5 shows the corresponding operation waveforms.

An external clock (signal) CLK, input into an input circuit 1, is transformed into an output control clock CLK0 via a delay circuit 2 and a buffer 3. Based on the clock CLK0, data DQ and a data control clock DQS are respectively output from a DQ output circuit 4 and a DQS output circuit 5. In this process, the delay time with respect to the delay circuit 2 is controlled by a phase comparing circuit 7 and a delay control circuit 8 so that the rising edge of a control clock signal RCLK, output from a dummy circuit 9, coincides with the rising edge of the input clock CLK. Accordingly, the timings of the output data DQ and the clock DQS coincide with the timing of the input clock CLK.

The phase comparing circuit 7 outputs a signal UP, which is (i) L (low) when the control clock signal RCLK rises after the rise of the external clock CLK (see the first half (on the left side) of FIG. 5), and (ii) H (high) when the control clock signal RCLK rises before the rise of the external clock CLK (see the second half (on the right side) of FIG. 5). The delay control circuit 8 receives the UP signal (H or L), and increases or decreases the delay time in accordance with the rising edge of a timing signal CCLK. In FIG. 5, the increase/decrease of the delay time is exaggerated in convenience of the explanations.

FIG. 6 shows the structure of the conventional phase comparing circuit 7, and FIG. 7 shows corresponding operation waveforms.

An edge-trigger D-FF (delay flip-flop) 11 transmits data at the data terminal D to the output terminal Q at the rising edge of a signal input into the clock terminal CK. That is, in the first D-FF 11 on the left side of FIG. 6, an external clock signal CLK is connected to data terminal D, and the control clock signal RCLK is connected to the clock terminal CK, wherein the external clock signal CLK is latched at the rising edge of the control clock signal RCLK. Generally, in the D-FF, when the transition timing at the data terminal D is sufficiently close to the rising edge of the signal at the clock terminal CK, a metastable phenomenon in which the signal output from the output terminal Q oscillates for a specific period may occur (see the second half of FIG. 7). When the bandwidth of the D-FF is relatively narrow, the signal output from the output terminal Q may not oscillate, but a metastable phenomenon, in which the signal output from the output terminal Q becomes unstable while keeping the center value, may occur. The following explanation is applicable to either case. In particular, with respect to the phase comparing circuit of a DLL, the DLL operates so that the rising edge of the control clock signal RCLK becomes closer to the rising edge of the external clock signal CLK, thereby increasing the possibility of an occurrence of the metastable phenomenon.

In a circuit for solving this problem, as shown in FIG. 6, the signal output from the D-FF 11 is applied via an inverter 12 to the data terminal of a D-FF 13, and the control clock signal RCLK is delayed by a time d1 by means of a delay circuit 14, and then applied as a signal UPCLK to the clock terminal CK of the D-FF 13, so that the signal output from the first D-FF 11 is latched by the second D-FF 13 after the delay time d1 has elapsed. That is, positive feedback is applied so as to prevent the signal from being affected by the above-described signal oscillation. The metastable phenomenon is a probability event, and the occurrence probability decreases in inverse proportion to an exponential function with respect to the duration time tMET (see FIG. 7) of the metastable phenomenon. That is, the occurrence probability is decreased by providing a sufficient amount of delay time d1 (between the two D-FFs 11 and 13) to a low value which can actually be disregarded (see, for example, Japanese Unexamined Patent Application, First Publication No. 2005-228426).

However, in recent years, the operation frequency of DRAMs has increased rapidly, and thus it is difficult to provide a sufficient amount of delay time d1. That is, if the delay time d1 is reduced in inverse proportion to the operation frequency so as to provide a sufficient operation margin, the occurrence probability of the metastable phenomenon rapidly increases. That is, as shown in the second half of FIG. 7, if the delay time d1 becomes shorter than the metastable duration time tMET, the relevant oscillation cannot be sufficiently reduced by using the second D-FF 13, which may cause an erroneous operation of the delay control circuit 8 (see FIG. 4)

SUMMARY OF THE INVENTION

In light of the above circumstances, an object of the present invention is to provide a phase comparing circuit for reducing the above-described delay time d1 while reliably preventing an erroneous operation of a next circuit connected to the phase comparing circuit.

Therefore, the present invention provides a phase comparing circuit for comparing phases between an external clock signal and a control clock signal, and outputting a control signal based on a result of the comparison, the phase comparing circuit comprising:

a first storage circuit for reading the external clock signal in accordance with the control clock signal;

a first inverter circuit for inverting a signal output from the first storage circuit based on a first threshold level;

a second inverter circuit for inverting a signal output from the first storage circuit based on a second threshold level;

a third inverter circuit for inverting a signal output from the first inverter circuit;

a fourth inverter circuit for inverting a signal output from the second inverter circuit;

a delay circuit for delaying the control clock signal by a specific time and outputting the delayed control clock signal;

a coincidence control circuit for setting the delayed control clock signal to be active when the signals output from the third and fourth inverter circuits coincide with each other, and setting it to be inactive when the signals output from the third and fourth inverter circuits do not coincide with each other; and a second storage circuit for reading a signal output form the first storage circuit when the delayed control clock signal is active, and outputting the read signal as the control signal.

In a typical example, the third and fourth inverter circuits each have a hysteresis characteristic.

In a preferable example, the coincidence control circuit includes:

a comparison circuit for comparing the signals output from the third and fourth inverter circuits, determining whether the signals coincide with each other, and outputting a determined result;

a latch circuit for reading a signal output from the comparison circuit, and outputting the read signal in accordance with the delayed control clock signal; and a gate circuit which is open or closed in accordance with a signal output from the latch circuit.

In another typical example, the first and second inverter circuits are each formed by a current mirror amplifier which inverts an input signal based on a reference voltage generated by a resistive division.

In accordance with the present invention, even if a metastable phenomenon occurs in the phase comparing circuit, an erroneous operation of a next circuit connected to the phase comparing circuit can be prevented. Therefore, it is possible to considerably reduce the delay time which is a known measure to handle the metastable phenomenon. Accordingly, the relevant DLL can be operated at a high frequency while providing a sufficient operation margin.

DETAILED DESCRIPTION OF THE INVENTION

Hereinafter, embodiments of the present invention will be described with reference to the appended figures.

First Embodiment

Figure 1:
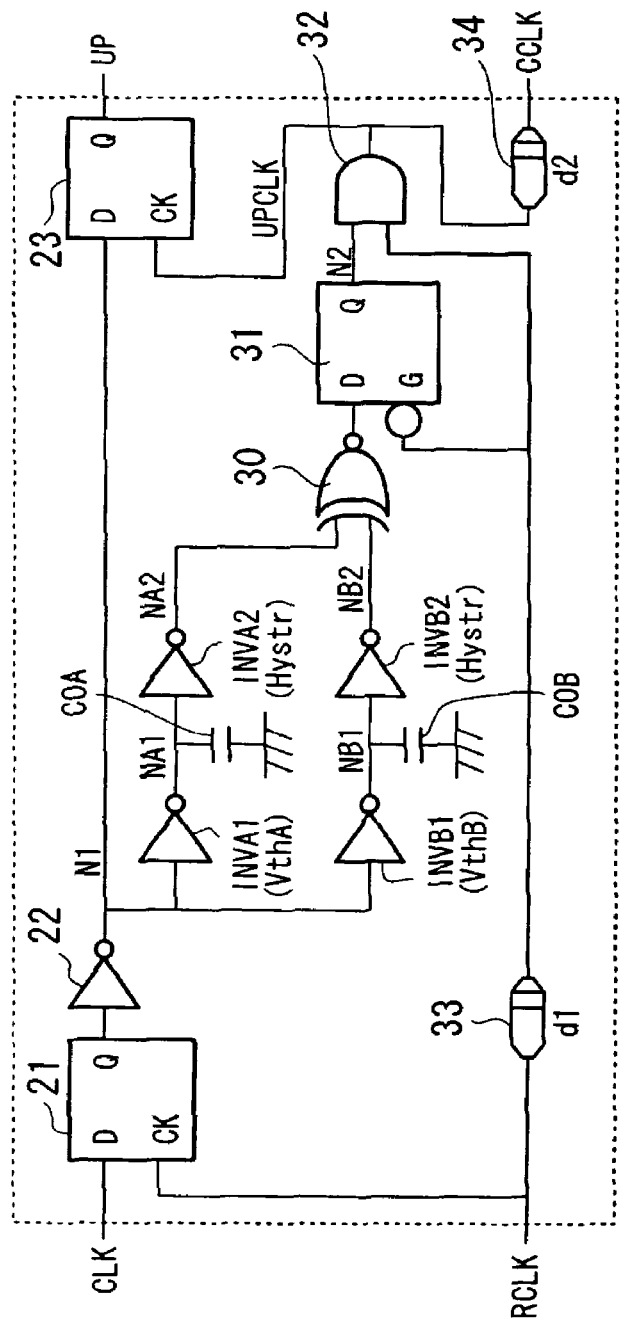
FIG. 1 is a block diagram showing the structure of a phase comparing circuit as a first embodiment of the present invention.
Figure 4:
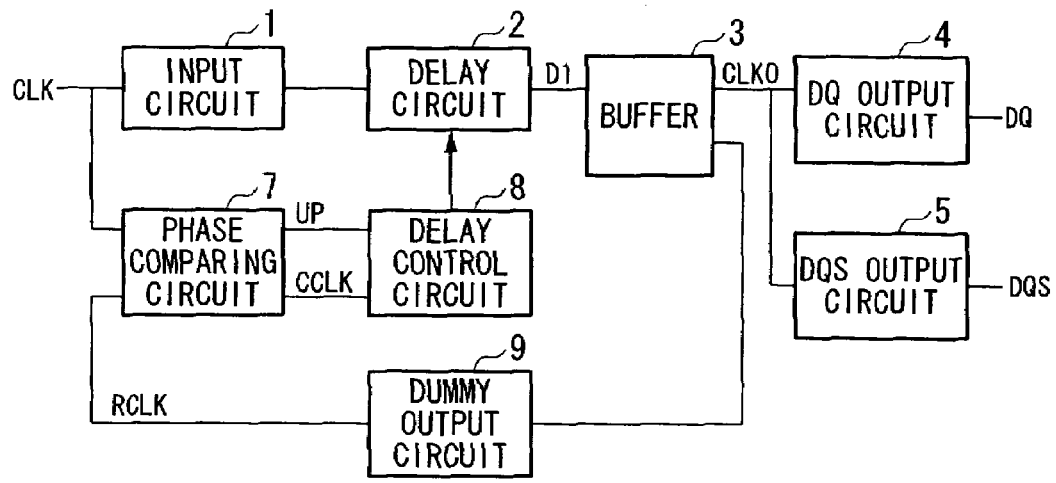
FIG. 4 is a general circuit diagram of a DLL.
Figure 5:
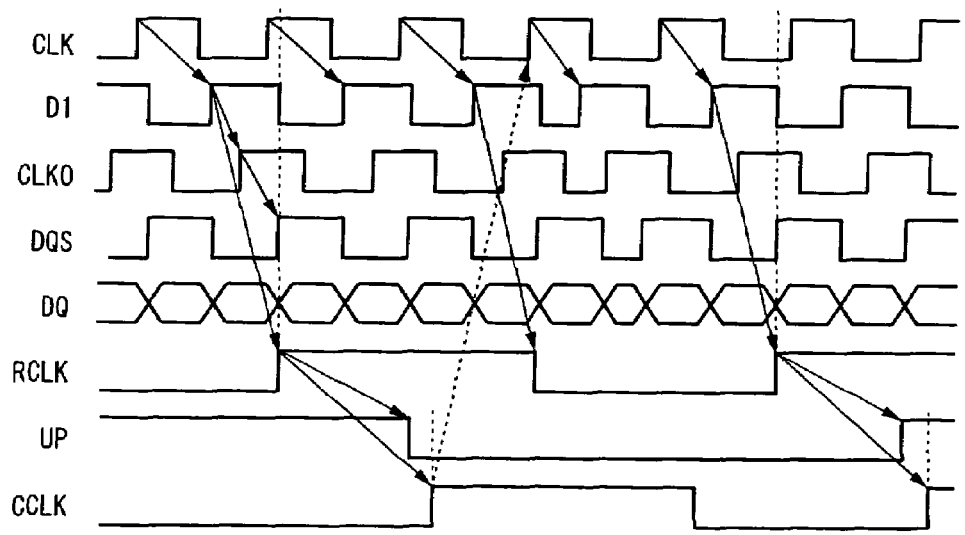
FIG. 5 is a waveform diagram used for explaining the operation of the DLL in FIG. 4.
Figure 6:
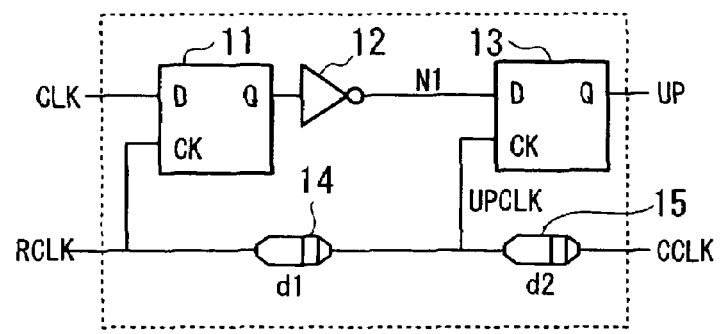
FIG. 6 is a block diagram showing the structure of a conventional example of the phase comparing circuit.
Figure 7:
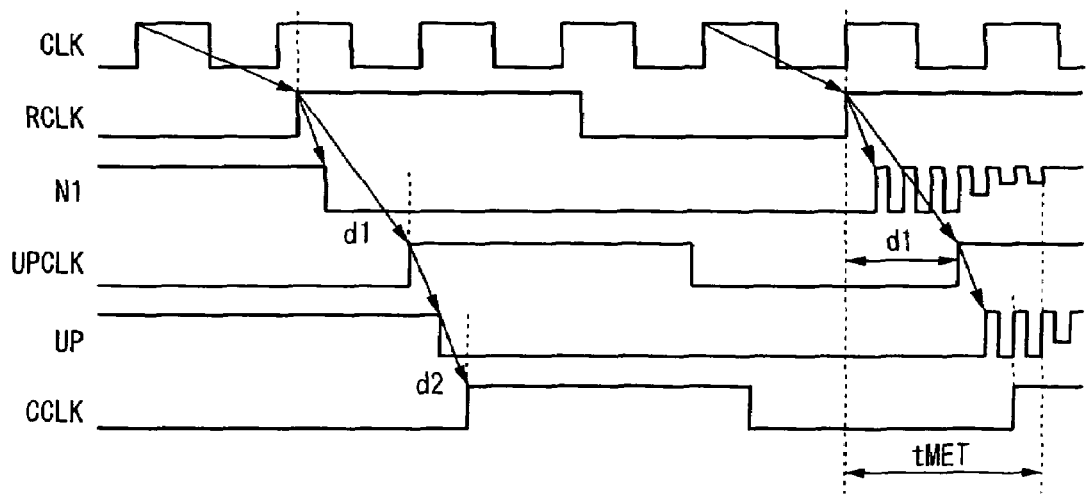
FIG. 7 is a waveform diagram used for explaining the operation of the conventional phase comparing circuit.

FIG. 1 is a block diagram showing the structure of a phase comparing circuit as a first embodiment of the present invention. This phase comparing circuit is used in a DLL circuit (refer to FIG. 4).

In FIG. 1, reference numeral 21 indicates a first D-FF used for reading the external clock signal CLK at the rising edge of the control clock signal RCLK output from the dummy output circuit 9 (see FIG. 4) of the DLL circuit. Reference numeral 22 indicates an inverter used for inverting and outputting the signal output from the D-FF 21. Reference numeral 23 indicates a second D-FF used for reading the signal output from the inverter 22 at the rising edge of a signal UPCLK.

Figure 2:
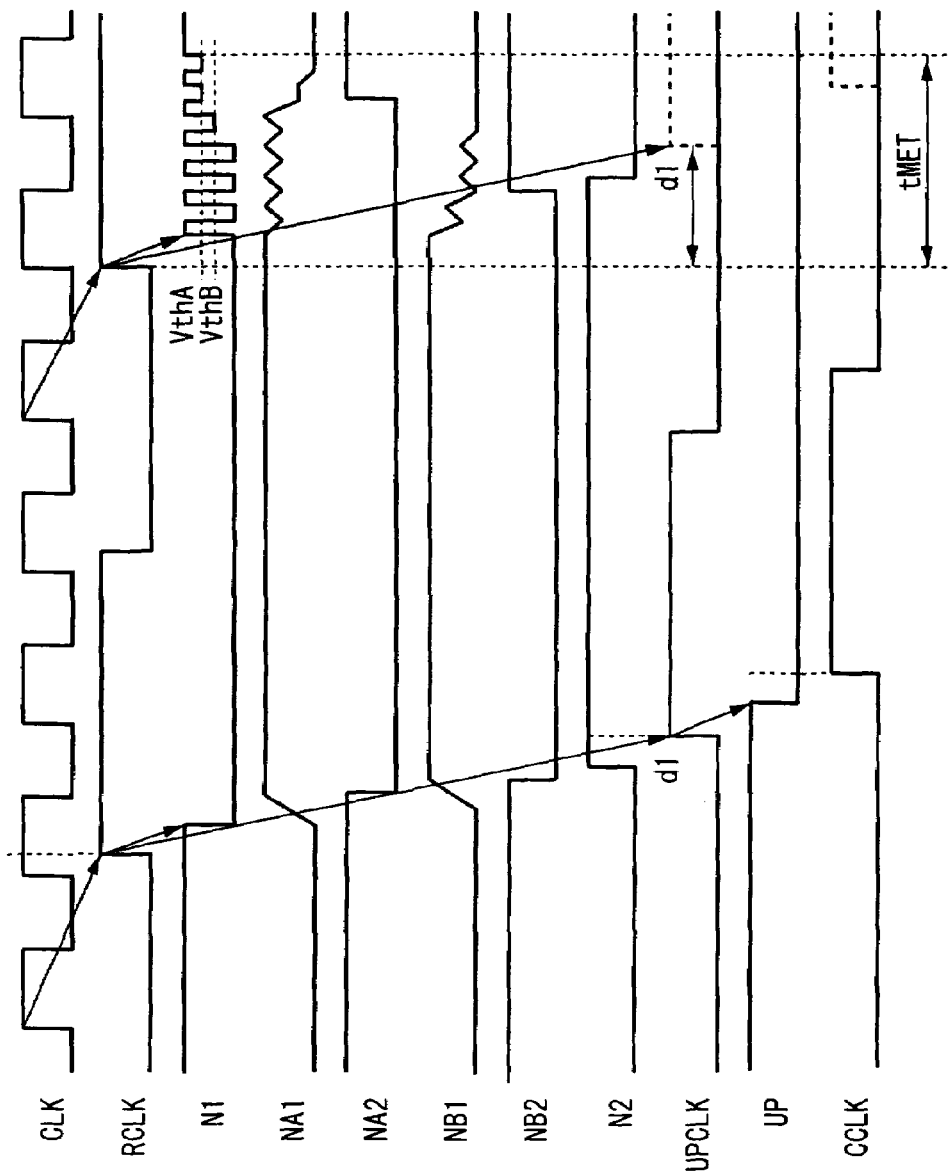
FIG. 2 is a waveform diagram used for explaining the operation in the first embodiment.

Reference symbols INVA1 and INVB1 each indicate an inverter used for inverting and outputting the signal output from the inverter 22, wherein the inverter INVA1 has a threshold level VthA which is higher than the threshold level VthB of the inverter INVB1 (see FIG. 2). Such a difference in the threshold level can be provided by an asymmetric sizing. That is, the input threshold level VthA can be higher than the intermediate value (between the relevant high and low levels) by reducing the channel width of a relevant NMOS transistor with respect to a corresponding PMOS transistor so that the NMOS has a relatively small channel width in comparison with general inverters. Also for the inverter INVB1, an asymmetric sizing is performed in the opposite direction.

Reference symbols COA and COB respectively indicate capacitors connected to the output terminals of the inverters INVA1 and INVB1. Reference symbols INVA2 and INVB2 are inverters which respectively invert and output signals NA1 and NB1 output from the inverters INVA1 and INVB1. The inverters INVA2 and INVB2 each have a hysteresis characteristic. That is, the threshold level when the signal NA1 (or NB1) is changed from "H" (high) to "L" (low) is lower than the intermediate value of the power source voltage, and the threshold level when the signal NA1 (or NB1) is changed from "L" to "H" is higher than the intermediate value of the power source voltage. Such an inverter operation is conventionally known, and can be implemented by adding an inverter used for feeding back the relevant signal from the output side to the input side to an ordinary inverter.

In the present embodiment, it is assumed that the capacitors COA and COB have the same capacitance, and the inverters INVA2 and INVB2 have the same hysteresis characteristic.

Reference numeral 30 indicates an EX-NOR circuit used for outputting an exclusive NOR result between a signal NA2 output from the inverter INVA2 and a signal NB2 output from the inverter INVB2. The signal output from the EX-NOR circuit 30 is input into the data terminal D of a flow-through D latch 31 used for preventing the occurrence of a hazard. In the D latch 31, when an "L" signal is applied to the G terminal, data at the data terminal D is output from the output terminal Q, and when the signal at the G terminal rises up to "H", the data at the data terminal D is latched and output from the output terminal Q. A signal N2 output from the output terminal Q is applied to the first input terminal of an AND gate 32.

Reference numeral 33 indicates a delay circuit used for outputting the control clock signal RCLK after delaying it by a specific time d1, and the signal output from the delay circuit 33 is input into the terminal G of the D latch 31 and the second input terminal of the AND gate 32. When the signal N2 is "H", the AND gate 32 outputs the signal, which is output from the delay circuit 33, as the signal UPCLK to the clock terminal CK of the D-FF 23 and the input terminal of a delay circuit 34. The delay circuit 34 delays the signal UPCLK by a time d2, and then outputs the delayed signal as a signal CCLK to the delay control circuit 8 (see FIG. 4) of the DLL circuit.

Below, the operation of the phase comparing circuit will be explained with reference to a waveform diagram of FIG. 2.

In the operation in which no metastable phenomenon occurs (see the first half of FIG. 2), when the external clock signal CLK (="H") is latched, the state of the signal N1 output from the inverter 22 is defined as "L". Therefore, the signals NA1 and NB1, which are respectively output from the inverters INVA1 and INVB1, are stably "H", and thus the signals NA2 and NB2, which are respectively output from the inverters INVA2 and INVB2, are both "L". That is, they coincide with each other. As a result, the signal output from the EX-NOR 30 becomes "H", and the signal N2 output from the D latch 31 becomes "H", so that the delayed signal (output from the delay circuit 33) of the control clock signal RCLK passes through the AND gate 32, and is supplied as the signal UPCLK to the D-FF 23 and the delay circuit 34. Accordingly, the signal "L" output from the inverter 22 is read by the D-FF 23, so that the D-FF 23 outputs the state signal UP which is "L", and the signal CCLK is output from the delay circuit 34.

These signals UP and CCLK are applied to the delay control circuit 8 (see FIG. 4), thereby activating the delay control circuit 8.

In contrast, in the operation in which a metastable phenomenon occurs (see the second half of FIG. 2), as the inverter INVA1 has the relatively high threshold level VthA, and the operational bandwidth is restricted by the capacitor COA, the charging time of the signal NA1 output from the inverter INVA1 is longer than the discharging time thereof. Therefore, oscillation having a relatively small amplitude occurs on the "H" side, while the signal level of the signal NA1 gradually decreases. In addition, as the inverter INVA2 has a hysteresis and a relatively low threshold level, the signal NA2 keeps "L" for a specific period.

On the other hand, as the inverter INVB1 has the relatively low threshold level VthB, the output signal NB1 rapidly decreases its level while oscillating. Therefore, the signal NB2 output from the inverter INVB2 becomes "H" relatively early. That is, after the signal NB2 becomes "H", the signal NA2 keeps "L" for a specific time during which the signal output from the EX-NOR 30 is "L". When the delayed signal of the control clock signal RCLK is output from the delay circuit 33 during the above specific time, an "L" signal is latched at the D latch 31, so that the AND gate 32 is closed, and no signal UPCLK is output. Therefore, when the metastable phenomenon continues during the delay time d1, the delay control circuit 8 (see FIG. 4) is not activated, thereby preventing an erroneous operation due to the metastable phenomenon.

Additionally, as the input threshold level of the inverter 22 is set at the center, that is, between the thresholds VthA and VthB, it can be regarded that the input logic value of the D-FF 23 is defined before the signal NA2 rises. Therefore, although the signals UPCLK and CCLK are generated when the signal NA2 rises before the delay time d1 has elapsed, no metastable phenomenon occurs because the signal N1 output from the inverter 22 is defined prior to the rise of the signal NA2.

In addition, the reason that the inverters INVA2 and INVB2 each have a hysteresis is to prevent the signals NA1 and NB1 from being inverted when they oscillate with a relatively small amplitude.

Additionally, the operational bandwidth can be reduced by another method in which the size of the inverter INVA2 is larger than that of the inverter INVA1. In this case, the relevant capacitor can be omitted.

Furthermore, similar effects can be also obtained when the threshold levels of the inverters INVA1 and INVB1 are the same, and the threshold levels of the inverters INVA2 and INVB2 are different from each other.

Second Embodiment

Figure 3:
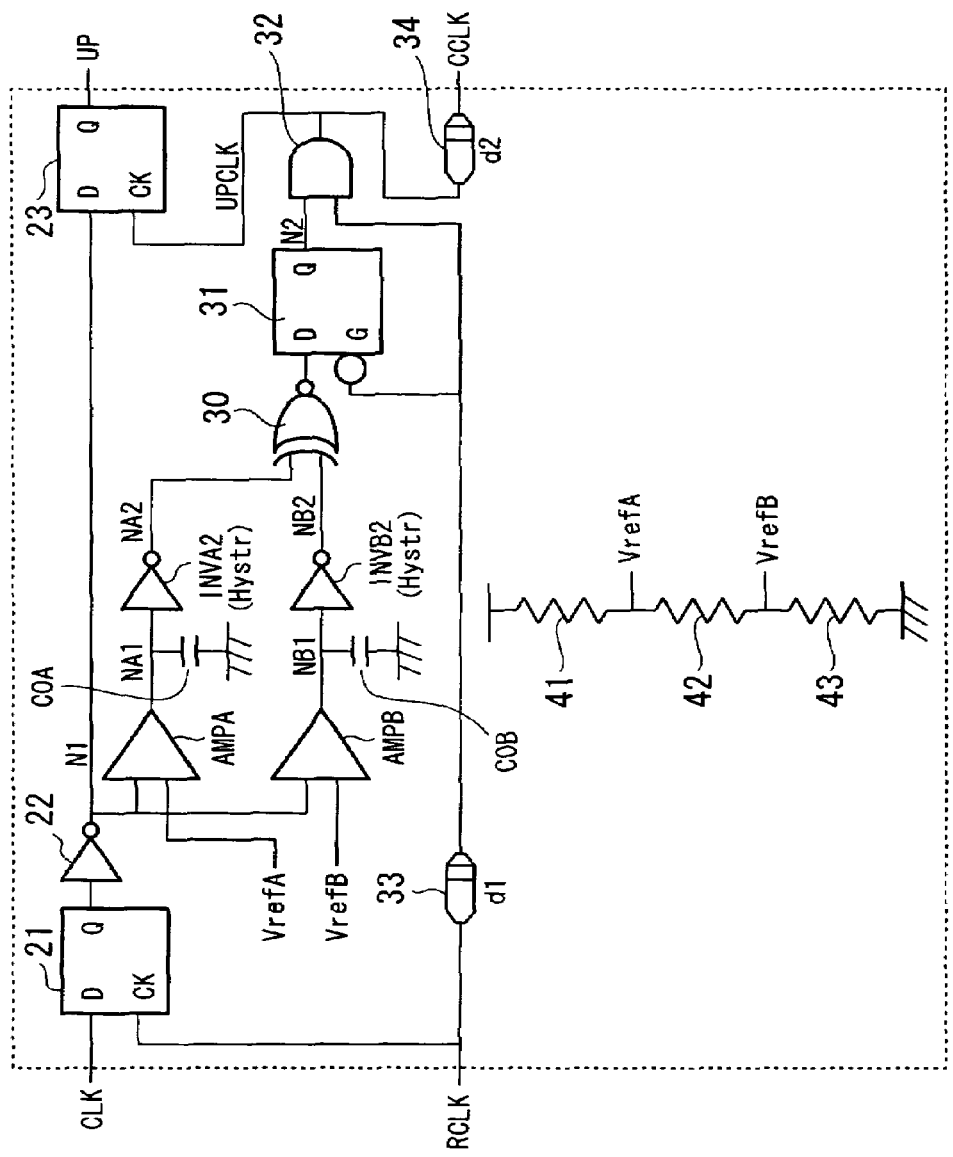
FIG. 3 is a block diagram showing the structure of a phase comparing circuit as a second embodiment of the present invention.

A second embodiment of the present invention will be shown in FIG. 3. In comparison with the first embodiment, the present embodiment has a distinctive feature in which in place of the inverters INVA1 and INVB1 which respectively have the thresholds VthA and VthB, current mirror amplifiers AMPA and AMPB are provided. The reference voltages of the amplifiers AMPA and AMPB are respectively voltages VrefA and VrefB (VrefA>VrefB), which are generated by a resistive division using resistors 41 to 43. The basic operation of the present embodiment is almost identical to that of the first embodiment (refer to FIG. 2). In the present embodiment, logic thresholds can be precisely controlled, and thus be set to optimum values.

While preferred embodiments of the invention have been described and illustrated above, it should be understood that these are exemplary embodiments of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

INDUSTRIAL APPLICABILITY

The present invention is preferably applied to a DLL circuit used in a DDR SDRAM, or the like.

What is claimed is:

1. A phase comparing circuit for comparing phases between an external clock signal and a control clock signal, and outputting a control signal based on a result of the comparison, the phase comparing circuit comprising:
   a first storage circuit for reading the external clock signal in accordance with the control clock signal;
   a first inverter circuit for inverting a signal output from the first storage circuit based on a first threshold level;
   a second inverter circuit for inverting a signal output from the first storage circuit based on a second threshold level;
   a third inverter circuit for inverting a signal output from the first inverter circuit;
   a fourth inverter circuit for inverting a signal output from the second inverter circuit;
   a delay circuit for delaying the control clock signal by a specific time and outputting the delayed control clock signal;
   a coincidence control circuit for setting the delayed control clock signal to be active when the signals output from the third and fourth inverter circuits coincide with each other, and setting it to be inactive when the signals output from the third and fourth inverter circuits do not coincide with each other; and
   a second storage circuit for reading a signal output form the first storage circuit when the delayed control clock signal is active, and outputting the read signal as the control signal.

2. The phase comparing circuit in accordance with claim 1, wherein the third and fourth inverter circuits each have a hysteresis characteristic.

3. The phase comparing circuit in accordance with claim 1, wherein the coincidence control circuit includes:
   a comparison circuit for comparing the signals output from the third and fourth inverter circuits, determining whether the signals coincide with each other, and outputting a determined result;
   a latch circuit for reading a signal output from the comparison circuit, and outputting the read signal in accordance with the delayed control clock signal; and
   a gate circuit which is open or closed in accordance with a signal output from the latch circuit.

4. The phase comparing circuit in accordance with claim 1, wherein the first and second inverter circuits are each formed by a current mirror amplifier which inverts an input signal based on a reference voltage generated by a resistive division.

* * * * *